United States Patent
Aranovsky

(10) Patent No.: US 7,692,450 B2
(45) Date of Patent: Apr. 6, 2010

(54) BI-DIRECTIONAL BUFFER WITH LEVEL SHIFTING

(75) Inventor: Anatoly Aranovsky, Los Gatos, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/124,063

(22) Filed: May 20, 2008

(65) Prior Publication Data

US 2009/0153193 A1    Jun. 18, 2009

Related U.S. Application Data

(63) Continuation-in-part of application No. 12/060,829, filed on Apr. 1, 2008.

(60) Provisional application No. 61/043,051, filed on Apr. 7, 2008, provisional application No. 61/024,476, filed on Jan. 29, 2008, provisional application No. 61/014,356, filed on Dec. 17, 2007.

(51) Int. Cl.
*H03K 19/094* (2006.01)

(52) U.S. Cl. ............................. 326/82; 326/83; 326/84; 326/85; 326/86; 326/87; 326/88; 326/89

(58) Field of Classification Search ............. 326/82–89, 326/26, 27, 38
See application file for complete search history.

(56) References Cited

U.S. PATENT DOCUMENTS

| | | | |
|---|---|---|---|
| 4,695,740 A | 9/1987 | Carter | |
| 4,713,557 A | 12/1987 | Carter | |
| 4,835,418 A | 5/1989 | Hsieh | |
| 4,982,115 A | 1/1991 | Lee | |
| 5,079,693 A | 1/1992 | Miller | |
| 5,107,148 A | 4/1992 | Millman | |
| 5,107,507 A | 4/1992 | Bland et al. | |
| 5,132,987 A | 7/1992 | Motohashi et al. | |
| 5,173,619 A | 12/1992 | Gaudenzi et al. | |
| 5,214,330 A | 5/1993 | Okazaki et al. | |
| 5,214,638 A | 5/1993 | Norz et al. | |
| 5,248,908 A | 9/1993 | Kimura | |

(Continued)

OTHER PUBLICATIONS

"LTC4300-A1/LTC4300A-2:Hot Swappable 2-Wire Bus Buffers," © Linear Technology Corporation, Milpitas, California (2001).

*Primary Examiner*—Jean B Jeanglaude
(74) *Attorney, Agent, or Firm*—Fliesler Meyer LLP

(57) ABSTRACT

A bi-directional buffer is connected between a first node and a second node, wherein the first node is connected by a first pull-up resistor to a first voltage supply rail, and the second node is connected by a second pull-up resistor to a second voltage supply rail. In an embodiment, the bi-directional buffer is enabled when a voltage of the first node does not exceed a first threshold voltage, and/or a voltage of the second node does not exceed a second threshold voltage. However, when the voltage of the first node exceeds the first threshold voltage, and the voltage of the second node exceeds the second threshold voltage, the bi-directional buffer is disabled, which disconnects the first and second nodes. This allows the first node to be pulled up to the first voltage supply rail, and the second node to be pulled up to the second voltage supply rail.

27 Claims, 8 Drawing Sheets

U.S. PATENT DOCUMENTS

| | | | |
|---|---|---|---|
| 5,295,246 A | 3/1994 | Bischoff et al. | |
| 5,300,835 A | 4/1994 | Assar et al. | |
| 5,381,062 A | 1/1995 | Morris | |
| 5,418,933 A | 5/1995 | Kimura et al. | |
| 5,428,649 A | 6/1995 | Cecchi | |
| 5,428,800 A | 6/1995 | Hsieh et al. | |
| 5,517,135 A | 5/1996 | Young | |
| 5,627,480 A | 5/1997 | Young et al. | |
| 5,644,729 A | 7/1997 | Amini et al. | |
| 5,715,405 A | 2/1998 | McClear et al. | |
| 5,736,870 A | 4/1998 | Greason et al. | |
| 5,790,526 A | 8/1998 | Kniess et al. | |
| 5,808,492 A | 9/1998 | Chow | |
| 5,859,545 A | 1/1999 | Thornblad | |
| 5,917,348 A | 6/1999 | Chow | |
| 5,923,187 A | 7/1999 | Maugers | |
| 6,046,605 A | 4/2000 | Ziemkowski et al. | |
| 6,060,906 A | 5/2000 | Chow et al. | |
| 6,075,384 A | 6/2000 | Sim et al. | |
| 6,275,066 B1 | 8/2001 | Park et al. | |
| 6,513,090 B1 | 1/2003 | Jeddeloh | |
| 6,650,174 B2 | 11/2003 | Bell | |
| 6,822,480 B1 | 11/2004 | McCalmont | |
| 6,834,318 B2 | 12/2004 | Hunter et al. | |
| 6,842,806 B2 | 1/2005 | Ervin | |
| 6,857,040 B2 | 2/2005 | Noonan et al. | |
| 7,032,051 B2 | 4/2006 | Reay | |
| 7,061,274 B2 | 6/2006 | George | |
| 7,205,793 B2 | 4/2007 | George | |
| 7,218,149 B2 | 5/2007 | Arai | |
| 7,292,067 B2 | 11/2007 | Schwarz | |
| 7,321,241 B1 | 1/2008 | Marak et al. | |
| 7,348,803 B2 * | 3/2008 | Bui et al. | 326/82 |
| 2005/0146358 A1 | 7/2005 | Barus et al. | |
| 2006/0038587 A1 | 2/2006 | Barus et al. | |
| 2006/0075170 A1 | 4/2006 | Behrendt et al. | |

\* cited by examiner

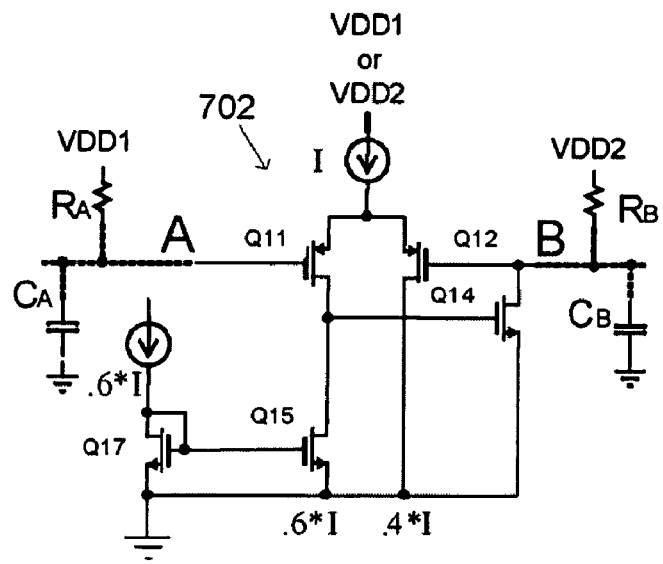
Fig. 7b (configuration that causes node B to follow node A)
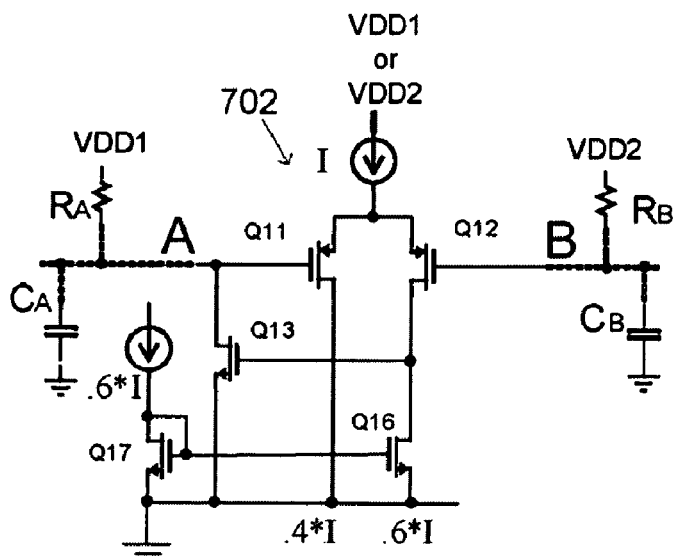
Fig. 7c (configuration that causes node A to follow node B)

US 7,692,450 B2

BI-DIRECTIONAL BUFFER WITH LEVEL SHIFTING

PRIORITY CLAIM

This patent application is a continuation-in-part of U.S. patent application Ser. No. 12/060,829, entitled "Bi-Directional Buffer for Open-Drain or Open-Collector Bus", which was filed Apr. 1, 2008, and which claims priority under 35 U.S.C. 119(e) to U.S. Provisional Patent Application No. 61/014,356, filed Dec. 17, 2007, and U.S. Provisional Patent Application No. 61/024,476, filed Jan. 29, 2008. This patent application also claims priority under 35 U.S.C. 119(e) to U.S. Provisional Patent Application No. 61/043,051, filed Apr. 7, 2008. Each of the above listed patent applications is incorporated herein by reference.

BACKGROUND

An open drain bus, such as an Inter-Integrated Circuit (I2C) bus, a System Management Bus (SMBus), and others, usually includes a data line and a clock line. Such a data line and a clock line can each be referred to individually as a bus line, or simply as a line. As shown in FIG. 1a, each bus line (e.g., 101) is connected to a pull-up resistor R, pull down transistors Q1, Q2 and Q3 (each associated with an interface device) and a capacitance C. The capacitance C represents distributed capacitance of the bus line and the total input capacitance of interface devices 111, 112 and 113. Data transfer rate depends on how fast the resistor R can charge the capacitance C.

To increase the maximum data transfer rate, a bus line 101 can be separated into segments (e.g., 101A, 101B and 101C), each having a reduced capacitance, as shown in FIG. 1b. FIG. 1b also shows that bi-directional buffers 102 can be used to transfer data between these segments. Each segment has its own pull-up resistor connected between the segment and a voltage supply rail. The bi-directional buffer $102_1$ is used to transfer data between the segments by making levels on node B track the level on node A and vise-versa—depending on the direction of data flow. Similarly, the bi-directional buffer $102_2$ is used to transfer data between the segments by making levels on node C track the level on node B and vise-versa—depending on the direction of data flow.

BRIEF DESCRIPTION OF THE DRAWINGS

FIG. 7b illustrates the bi-directional buffer of FIG. 7a configured such that node B follows node A.

FIG. 7c illustrates the bi-directional buffer of FIG. 7a configured such that node A follows node B.

SUMMARY OF THE INVENTION

Embodiments of the present invention are directed to bi-directional buffers, methods for bi-directional buffering, and methods for use with bi-directional buffers. Embodiments of the present invention are also directed to devices (e.g., PCB cards) and systems that include bi-directional buffers. A bi-directional buffer can be connected between a first node and a second node, wherein the first node is connected by a first pull-up resistor to a first voltage supply rail, and the second node is connected by a second pull-up resistor to a second voltage supply rail that is different than the first voltage supply rail. In accordance with an embodiment, a method includes enabling the bi-directional buffer when a voltage of the first node does not exceed a first threshold voltage, and/or a voltage of the second node does not exceed a second threshold voltage. However, when the voltage of the first node exceeds the first threshold voltage, and the voltage of the second node exceeds the second threshold voltage, the bi-directional buffer is disabled. When the bi-directional buffer is disabled, the first and second nodes are disconnected from one another, thereby allowing the first node to be pulled up to the first voltage supply rail, and the second node to be pulled up to the second voltage supply rail, which is desirable for proper system operation when the first and second voltage supply rails provide different voltages levels. The first and second threshold voltages can be different form one another, or the same.

In accordance with an embodiment of the present invention, a voltage of a first node is allowed to follow a voltage of a second node, and the voltage of the second node is allowed to follow the voltage of the first node, when the voltage of the first node does not exceed a first threshold voltage, and/or the voltage of the second node does not exceed a second threshold voltage. However, when the voltage of the first node exceeds the first threshold voltage, and the voltage of the second node exceeds the second threshold voltage, then the voltage of the first node is allowed to be pulled up to the voltage of the first voltage supply rail, and the voltage of the second node is allowed to be pulled up to the voltage of the second voltage supply rail. The first and second threshold voltages can be the same, or different.

Further and alternative embodiments, and the features, aspects, and advantages of the embodiments of invention will become more apparent from the detailed description set forth below, the drawings and the claims.

DETAILED DESCRIPTION

Figure 1A:
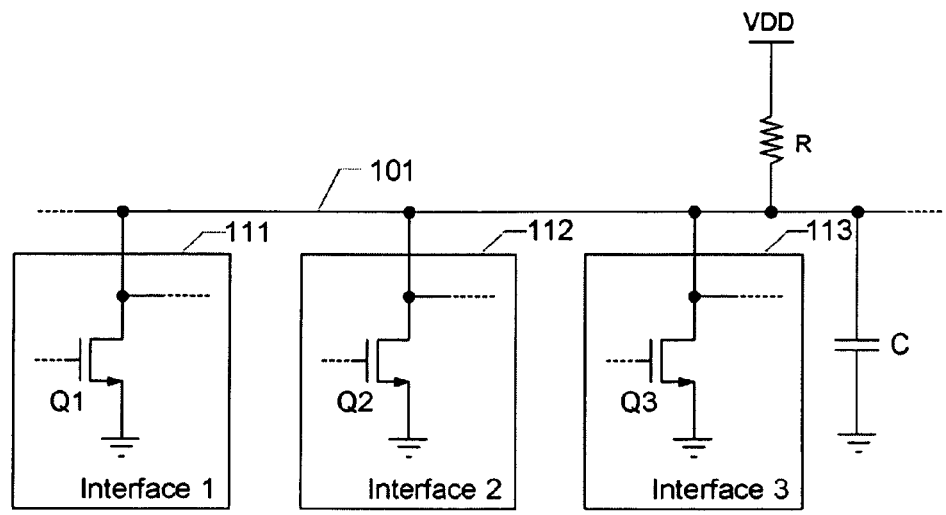
FIG. 1a illustrates an exemplary open-drain bus.
Figure 1B:
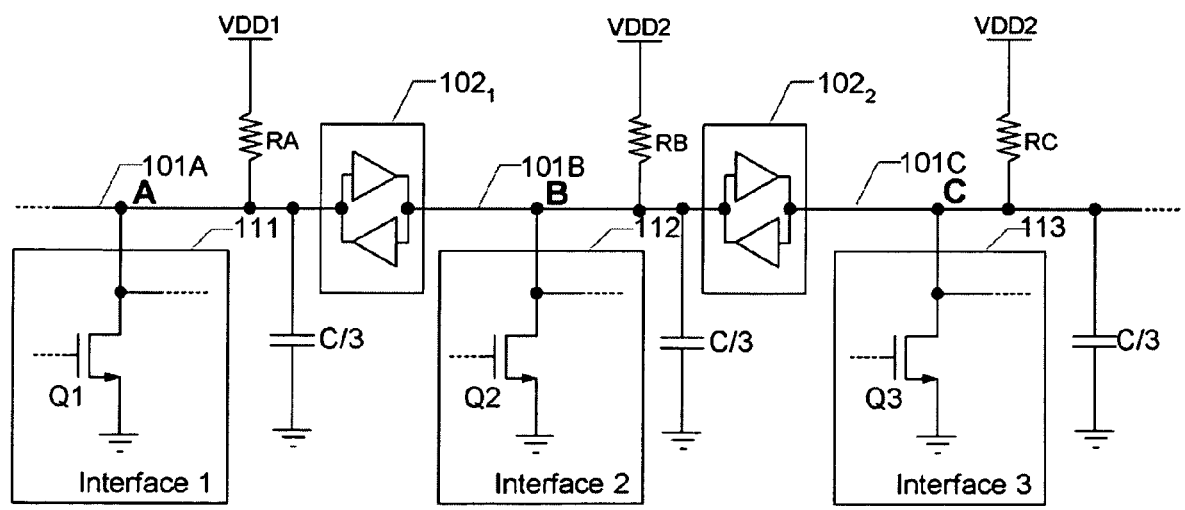
FIG. 1b illustrates how the exemplary open-drain bus of FIG. 1a can be separated into multiple segments using bi-directional buffers.

The bi-directional buffer arrangement of FIG. 1b works well when different bus segments are pulled up to the same voltage supply rail, or two voltage supplies rails that have substantially identical voltages. However, a problem arises when voltages supply rails are not equal, e.g., as shown in FIG. 1b, where it is presumed that VDD2>VDD1.

Referring to FIG. 1b, since the bi-directional buffer $102_1$ tracks voltage levels (keeps them equal), the side with the higher VDD (VDD2 in this example) will be sitting at the same level as the side with the lower VDD (VDD1 in this example) during a high state. This means that during the high state the bus segment pulled up by the higher voltage rail (node B) will be at the VDD1 level and will not reach VDD2, which is required for proper system operation. It would be beneficial to overcome this deficiency of existing bi-directional buffers.

Figure 2A:
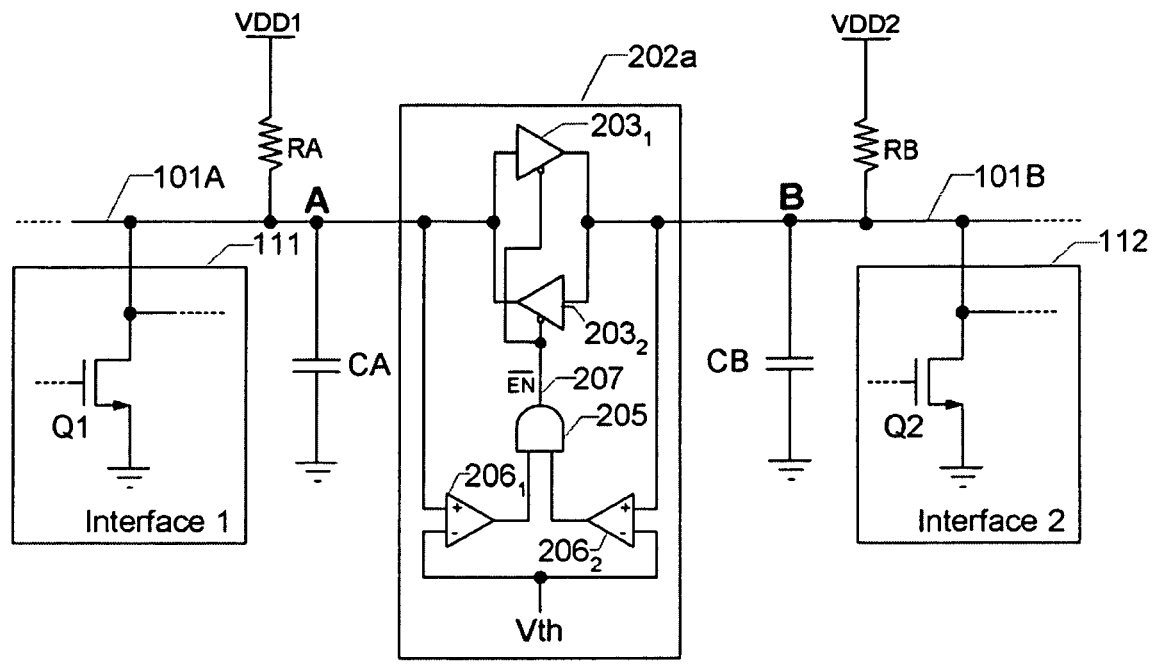
FIG. 2a illustrates a bi-directional buffer according to an embodiment of the present invention.

FIG. 2a illustrates a bi-directional buffer 202a, according to an embodiment of the present invention. The bi-directional buffer 202a includes first voltage buffer circuitry $203_1$ that causes node B to follow node A, when the direction of data flow is from node A to node B. The bi-directional buffer 202a also includes second voltage buffer circuitry $203_2$ that causes node A to follow node B, when the direction of data flow is from node B to node A. Note that the first voltage buffer circuitry $203_1$ and the second voltage buffer circuitry $203_2$ can share some circuitry (e.g., share some transistors), depending on the implementation.

As described below, the bi-directional buffer 202a provides a level shifting function so that the high level of each bus segment (101A and 101B) will be equal to the level of its own voltage supply rail (VDD1 and VDD2, respectively). In the embodiment shown, comparators $206_1$ and $206_2$ and a logic gate 205 produce an ENABLE_BAR signal 207, which enables the first voltage buffer circuitry $203_1$ and the second voltage buffer circuitry $203_2$ when the ENABLE_BAR signal 207 is low. In other words, the first voltage buffer circuitry $203_1$ and the second voltage buffer circuitry $203_2$ are enabled when the signal 207 provided to their enable inputs is low. In the arrangement shown, the ENABLE_BAR signal 207 will be low so long as the voltage of at least one of the bus segments 101A and 101B is less than a threshold voltage Vth. In contrast, when the voltages of both bus segments 101A and 101B are above Vth, then the ENABLE_BAR signal 207 will be high, thereby disabling the first voltage buffer circuitry $203_1$ and the second voltage buffer circuitry $203_2$. When the first voltage buffer circuitry $203_1$ and the second voltage buffer circuitry $203_2$ are disabled, the bus segments 101A and 101B are disconnected from one another, and the bus segments 101A and 101B will not follow one another, thereby allowing each node to be pulled up (by appropriate resistors RA and RB) to its own voltage supply rail (VDD1 and VDD2). This is described in further detail below.

In accordance with an embodiment, the ENABLE_BAR input is controlled by the logic gate 205, with inputs to the logic gate 205 receiving outputs of the two comparators $206_1$ and $206_2$. The comparator $206_1$ has its inputs connected to the bus segment 101A and a threshold voltage Vthr. The comparator $206_2$ has its inputs connected to the bus segment 101B and the threshold voltage Vthr.

When node A is pulled down toward GND by an external device (e.g., Q1), it goes below Vthr. This will cause the output of the corresponding comparator $206_1$ to go low, which in turn will cause the output of the logic gate 205 to also be low. This enables the bi-directional buffer 202a which makes node B track node A, bringing it to GND potential as well. Thus both segments are in the low state.

After node A is released by an external device (e.g., Q1), it starts moving higher. Since the first voltage buffer circuitry $203_1$ and the second voltage buffer circuitry $203_2$ are enabled, node B starts moving higher as well. At some point in time both nodes A and B will be higher than Vthr. Once this happens, the outputs of both comparators $206_1$ and $206_2$ will go high, and so will the output of the logic gate 205. This will disable the bi-directional buffer 202a, and no tracking will take place anymore. From this moment nodes A and B will move higher independently, and ultimately bring their voltage levels to VDD1 and VDD2, respectively. Thus level shifting functionality is achieved and will be maintained as long as Vthr is set below lowest of the voltage supply rails (VDD1, in this example), but greater than GND. For example, Vthr can equal VDDmin (VDD1 in this example) minus an offset (e.g., 0.5V or 0.7V), or Vthr can equal a percentage of VDDmin (e.g., 90% or 95% of VDD1). These are just a few examples, which are not meant to be limiting.

Figure 2B:
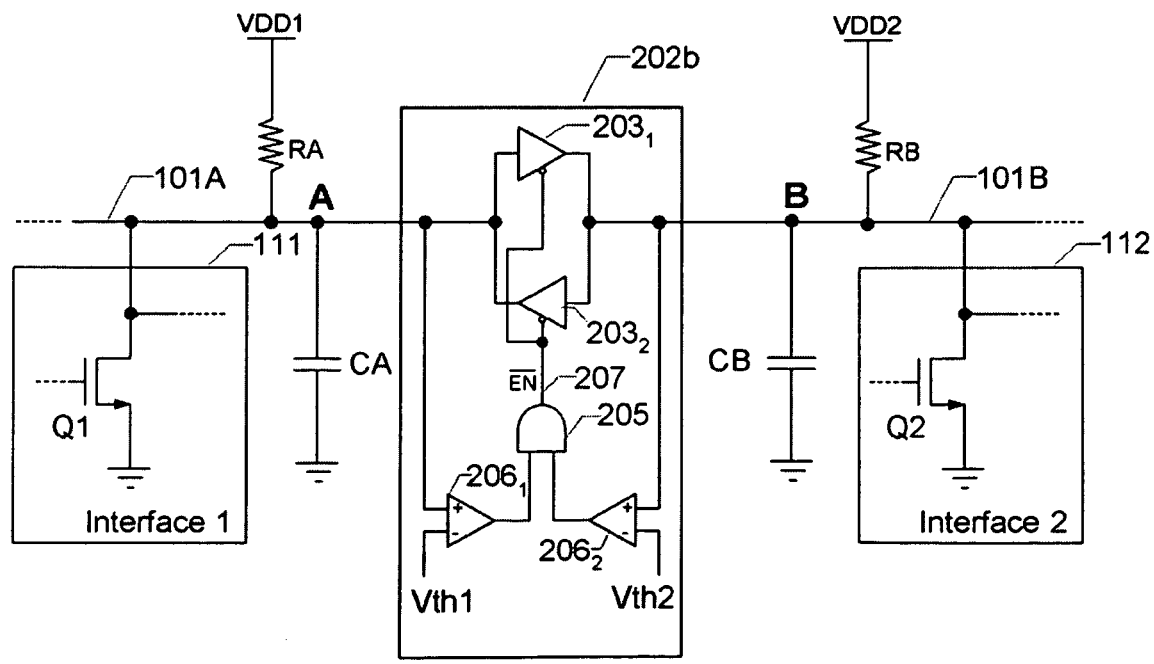
FIG. 2b illustrates the bi-directional buffer according to another embodiment of the present invention.

In FIG. 2a, the same threshold voltage Vthr is provided to both comparators $206_1$ and $206_2$. The level shifting function will be preserved so long as GND<Vthr<VDDmin (VDDmin=VDD1 in this example). Alternatively, it's possible to have two independent thresholds, i.e., one for each comparator 206, as shown in FIG. 2b. In FIG. 2b, the level shifting function will be preserved as long as: GND<Vthr1<VDD1; and GND<Vthr2<VDD2. For example, Vthr1 can equal VDD1 minus an offset, and Vthr2 can equal VDD2 minus the same or a different offset. For another example, Vthr1 can equal a percentage of VDD1 (e.g., 80% or 90% of VDD1), and Vthr2 can equal the same or a different percentage of VDD2 (e.g., 85% of VDD2). These are just a few examples, which are not meant to be limiting.

In accordance with a specific embodiment, the one or more threshold (e.g., Vth, or Vth1 and Vth2) is/are programmable, so that the threshold(s) can be adjusted in view of the voltage supply rails with which the bi-directional buffer will be used. In still another embodiment, the one or more threshold (e.g., Vth, or Vth1 and Vth2) can be generated based on the voltage supply rails, e.g., can be a fixed or programmable voltage below (e.g., 0.4 or 0.6V below), or a fixed or programmable percentage (e.g., 75% or 85%) of the voltage supply rail(s).

The bi-directional buffers of embodiments of the present invention can be used to interconnect segments of bus lines. Exemplary types of buses in which embodiments of the present invention can be used include, e.g., I2C and SMBus, but are not limited thereto. For example, different segments of a Controller Area Network (CAN) bus can also be connected using bi-directional buffers of embodiments of the present invention.

Figure 3:
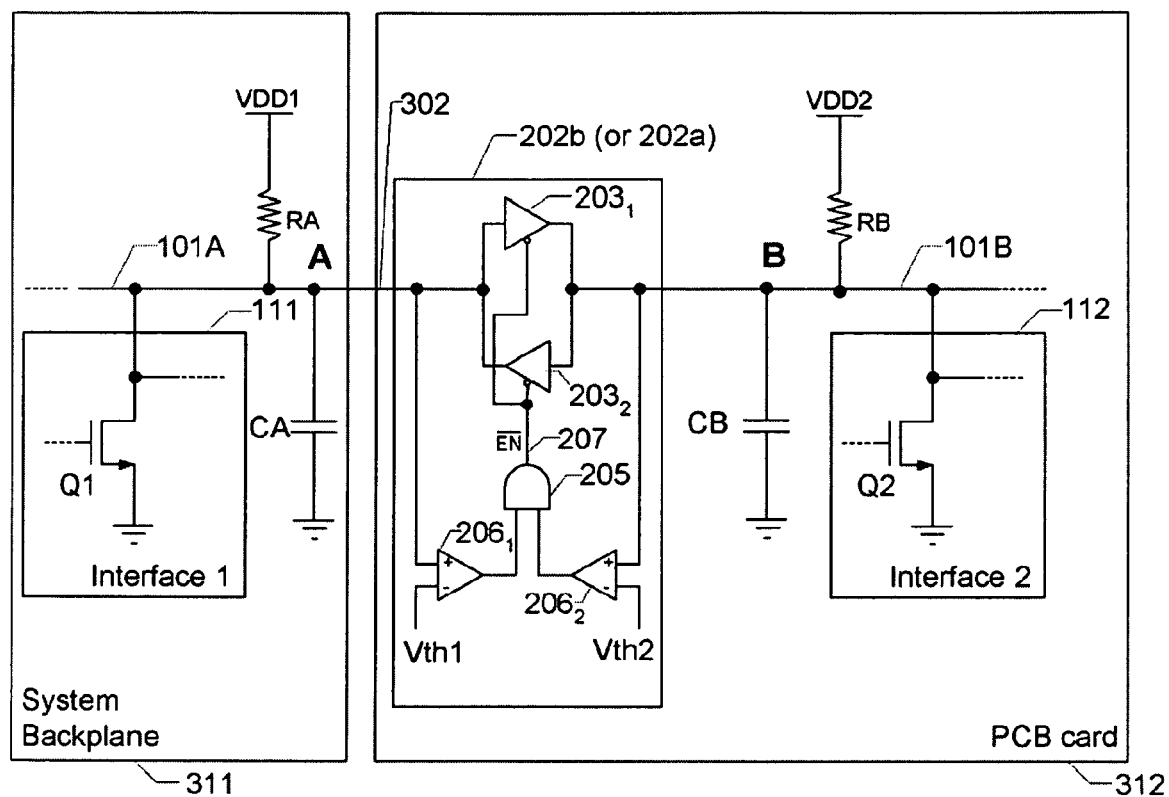
FIG. 3 illustrates a system according to an embodiment of the present invention that includes a bi-directional buffer interconnecting two bus line segments, where an interface device of a PCB card is connected to one of the bus line segments and an interface device of a system backplane is connected to the other bus line segment.

Referring to FIG. 3, the bi-directional buffers 202a and 202b of the present invention can be used, e.g., for interconnecting a PCB card 312 with a system backplane 311. In such a case, as shown in FIG. 3, the bi-directional buffer 202a or 202b can be built onto the PCB card 312. More generally, the buffers of embodiments of the present invention can be used to interconnect devices that include open-drain or open-collector circuitry for driving a bus line.

In FIG. 3, the PCB card 312 includes a terminal 302 (e.g., a pin) that connects the PCB card to a system backplane 311. The bi-directional buffer 202a or 202b of the PCB card is connected between the terminal 302 and an internal node (e.g., node B) of the PCB card 312. Included on the PCB card is also circuitry to selectively enable and disable the bi-directional buffer 202a or 202b. Such circuitry can include the comparators $206_1$ and $206_2$ and the logic gate 205, but are not limited thereto. This circuitry enables the bi-directional buffer when a voltage of the terminal 302 does not exceed a first threshold voltage (e.g., Vth1), and/or a voltage of the internal node (e.g., node B) does not exceed a second threshold voltage (e.g., Vth2). The circuitry disables the bi-directional buffer when the voltage of the terminal exceeds the first threshold voltage, and the voltage of the internal node exceeds the second threshold voltage. As with other embodiments, the first and second threshold voltages can be the same or different.

In FIGS. 2a, 2b and 2c, the logic circuitry 205 is shown as being an AND gate. One of ordinary skill in the art would appreciate that alternative logic circuitry can be used, so long as the first and second voltage buffer circuitry $203_1$ and $203_2$ are enabled and disabled at the correct times, i.e., under the correct conditions. Similarly, it's possible that the first and second voltage buffer circuitry $203_1$ and $203_2$ are enabled in response to their enable inputs being high (rather than low), so long as the first and second voltage buffer circuitry $203_1$ and $203_2$ are enabled and disabled at the correct times.

Figure 4:
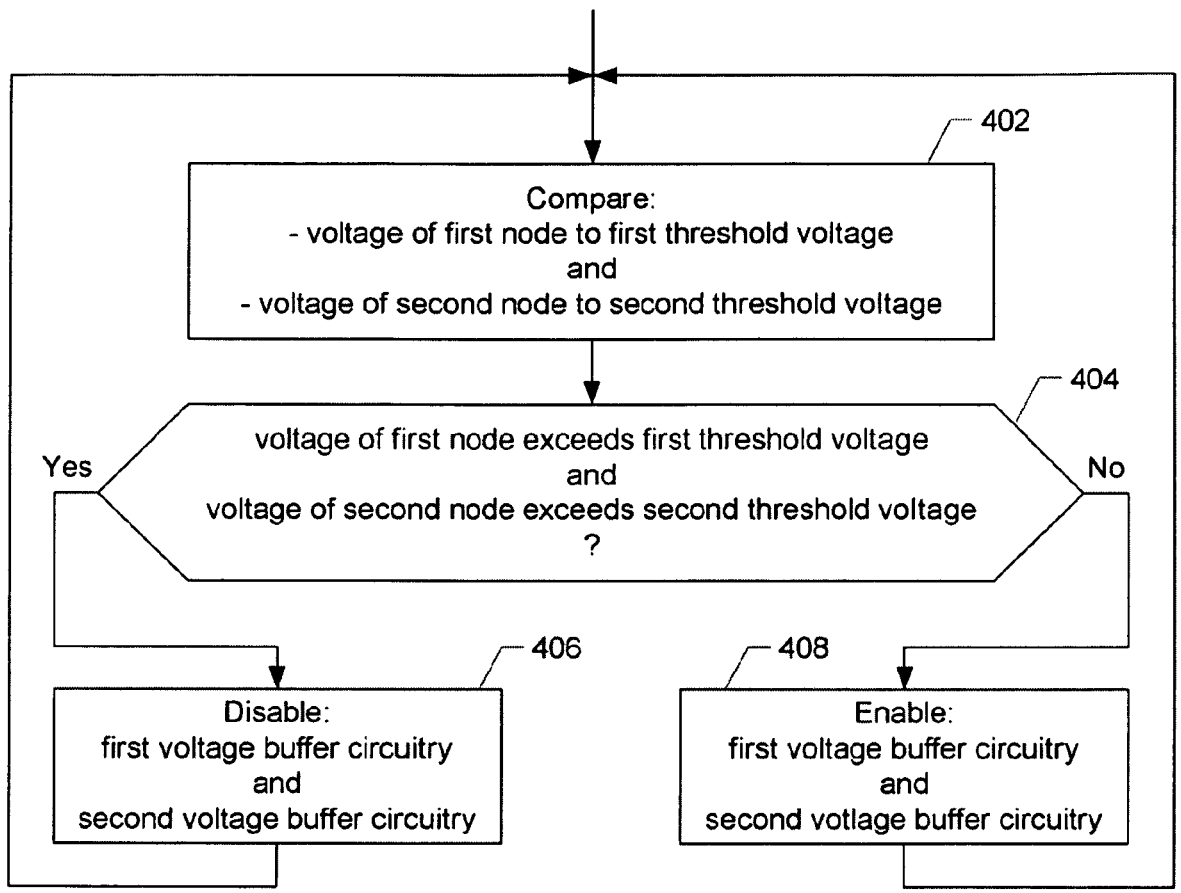
FIGS. 4 and 5 are high level flow diagrams that are used to describe methods according to embodiments of the present invention.

The high level flow diagram of FIG. 4 summarizes a method, according to an embodiment of the present invention, for bi-directional buffering using first voltage buffer circuitry that causes a first node to follow a second node, and second voltage buffer circuitry that causes the second node to follow the first node. At step 402, a voltage of the first node is compared to a first threshold voltage, and a voltage of the second node is compared to a second threshold voltage. At step 404 there is a determination of whether the voltage of the first node exceeds the first threshold voltage, and the voltage of the second node exceeds the second threshold voltage. If the answer to 404 is yes (i.e., when the voltage of the first node exceeds the first threshold voltage, and the voltage of the second node exceeds the second threshold voltage), then flow goes to step 406. If the answer to 404 is no (i.e., the voltage of the first node does not exceed the first threshold voltage, and/or the voltage of the second node does not exceed the second threshold voltage), then flow goes to step 408.

At step 408, the first voltage buffer circuitry and the second voltage buffer circuitry are enabled (i.e., when the voltage of the first node does not exceed the first threshold voltage, and/or the voltage of the second node does not exceed the second threshold voltage). At step 406, the first voltage buffer circuitry and the second voltage buffer circuitry are disabled (i.e., when the voltage of the first node exceeds the first threshold voltage, and the voltage of the second node exceeds the second threshold voltage). When the first voltage buffer circuitry and the second voltage buffer circuitry are disabled the first and second nodes are disconnected from one another, thereby enabling the first node to be pulled up to a voltage of a first voltage rail, and the second node to be pulled up to a voltage of a second voltage rail.

As shown in FIGS. 2a, 2b and 3, the first node can be connected by a first pull-up resistor to a first voltage supply rail (e.g., VDD1), and the second node can be connected by a second pull-up resistor to a second voltage supply rail (e.g., VDD2). As also explained above, GND<first threshold voltage<the first voltage supply rail, and GND<second threshold voltage<the second voltage supply rail. As described above with reference to FIG. 2a, the first and second threshold voltages can be the same. Alternatively, as described above with reference to FIG. 2b, the first and second threshold voltages can be different.

Figure 5:
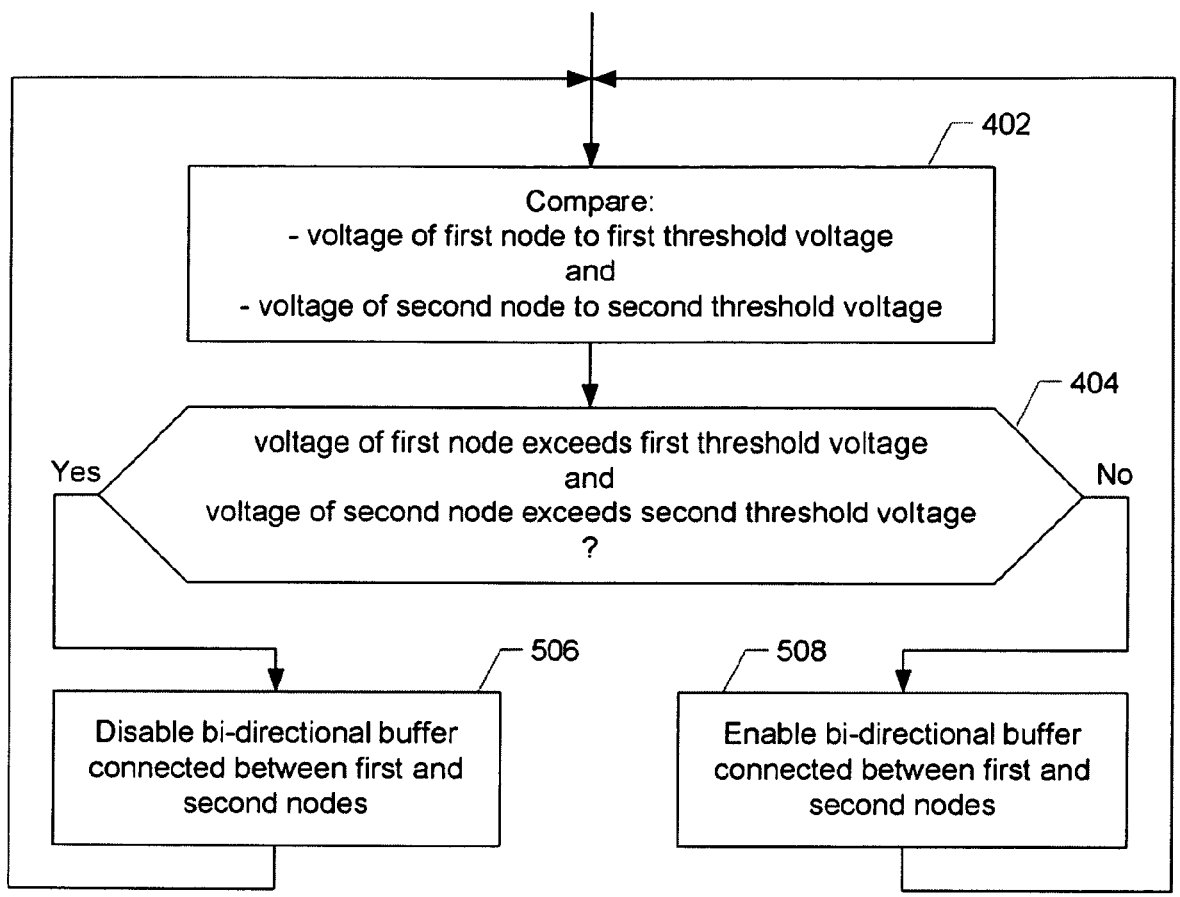

Another way of viewing an embodiment of the present invention is that it is selectively enables or disables a bi-directional buffer (e.g., 102), as described with reference to the high level flow diagram of FIG. 5. More specifically, FIG. 5 is used to describe a method for use with a bi-directional buffer that is connected between first and second nodes. Steps 402 and 404 in FIG. 5 are the same as in FIG. 4, and thus need not be described again. At a step 508, the bi-directional buffer is enabled (i.e., when the voltage of the first node does not exceed the first threshold voltage, and/or the voltage of the second node does not exceed the second threshold voltage). At a step 506, the bi-directional buffer is disabled (i.e., when the voltage of the first node exceeds the first threshold voltage, and the voltage of the second node exceeds the second threshold voltage). When the bi-directional buffer is disabled the first and second nodes are disconnected from one another, thereby enabling the first node to be pulled up to a voltage of a first voltage rail, and the second node to be pulled up to a voltage of a second voltage rail. As described above, the first and second threshold voltages can be the same, or different.

A further way of viewing an embodiment of the present invention is that a voltage of a first node is allowed to follow a voltage of a second node, and the voltage of the second node is allowed to follow the voltage of the first node, when the voltage of the first node does not exceed a first threshold voltage, and/or the voltage of the second node does not exceed a second threshold voltage. However, when the voltage of the first node exceeds the first threshold voltage, and the voltage of the second node exceeds the second threshold voltage, then the voltage of the first node is allowed to be pulled up to the voltage of the first voltage supply rail, and the voltage of the second node is allowed to be pulled up to the voltage of the second voltage supply rail. The first and second threshold voltages can be the same, or different.

Exemplary circuitry for accomplishing the enabling and disabling referred to in the flow diagrams of FIGS. 4 and 5 can include the comparators $206_1$ and $206_2$ and the logic gate 205, but are not limited thereto. In other words, alternative circuitry that performs the enabling and disabling as described in FIGS. 4 and/or 5 are also within the scope of the present invention. Some examples of such alternative circuitry are described herein, but embodiments of the present invention should not be limited to only the described alternatives.

As can be appreciated from the high level flow diagram of FIG. 5, embodiments of the present invention can be used to enable and disable existing bi-directional buffers. In other words, circuitry can be added within an existing bi-directional buffer, or external to an existing bi-directional buffer, to implement the method described with reference to FIG. 5. For example, FIG. 6 shows how circuitry can be added external to an existing bi-directional buffer 102, to implement the method described with reference to FIG. 5.

Figure 6:
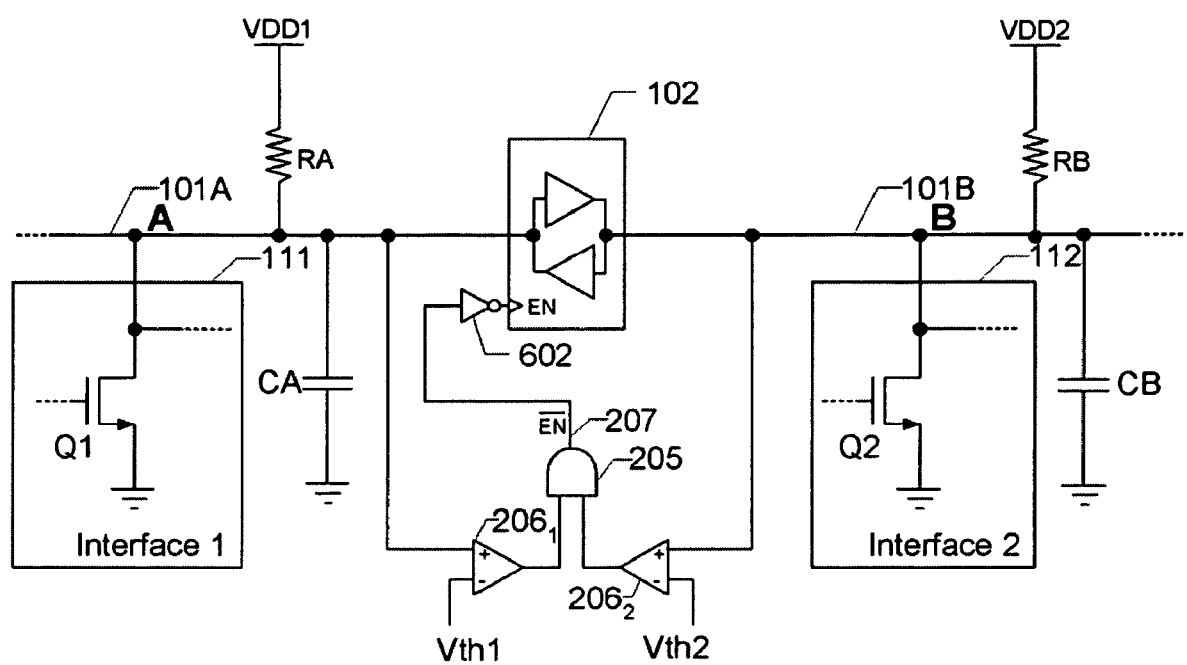
FIG. 6 illustrates how embodiments of the present invention can be used to provide level shifting for an existing bi-directional buffer.

In FIG. 6, the bi-directional buffer 102 is enabled when the voltage of node A does not exceed the threshold voltage Vth1, and/or the voltage of node B does not exceed the threshold voltage Vth2. The bi-directional buffer 102 is disabled when the voltage of node A exceeds the threshold voltage Vth1, and the voltage of the node B exceeds the threshold voltage Vth2. As described above, Vth1 and Vth2 can be the same, or different.

Referring to FIG. 6, assume the bi-directional buffer 102 has an enable (EN) high input. Because the output of the AND logic gate 205 is ENABLE_BAR, an inverter 602 has been added. Alternatively, different logic circuitry can be used in place of the AND gate, e.g., the AND gate can be replaced with a NAND gate and the inverter 602 would be removed. If the bi-directional buffer 102 has an enable low input, then the inverter 602 could be removed, and the AND gate can be used. Use of alternative logic circuitry, such as, but not limited to a NOR gate, is also possible, so long as the appropriate functionality is performed. It is also possible to provide the voltage thresholds (Vth1 and Vth2) to the non-inverting (+) inputs of the comparators $206_1$ and $206_2$, and to connect the inverting (−) inputs of the comparators $206_1$ and $206_2$ to nodes A and B, and to replace the AND logic gate 205 with a NOR gate (or replace the AND logic gate 205 with an OR gate and remove the inverter 602; or replace the AND logic gate 205 with an OR gate and configure the bi-directional buffer 102 be enabled in response to a low enable input). These are just a few alternative configurations, which are not meant to be all inclusive. One of ordinary skill in the art would appreciated how further alternative configurations can be used to accomplish the desired functionality. Use of such alternative circuitry and configurations also applies to the embodiments described above with reference to FIGS. 2a, 2b, 3, and below with references to FIGS. 7a-7c.

Figure 7A:
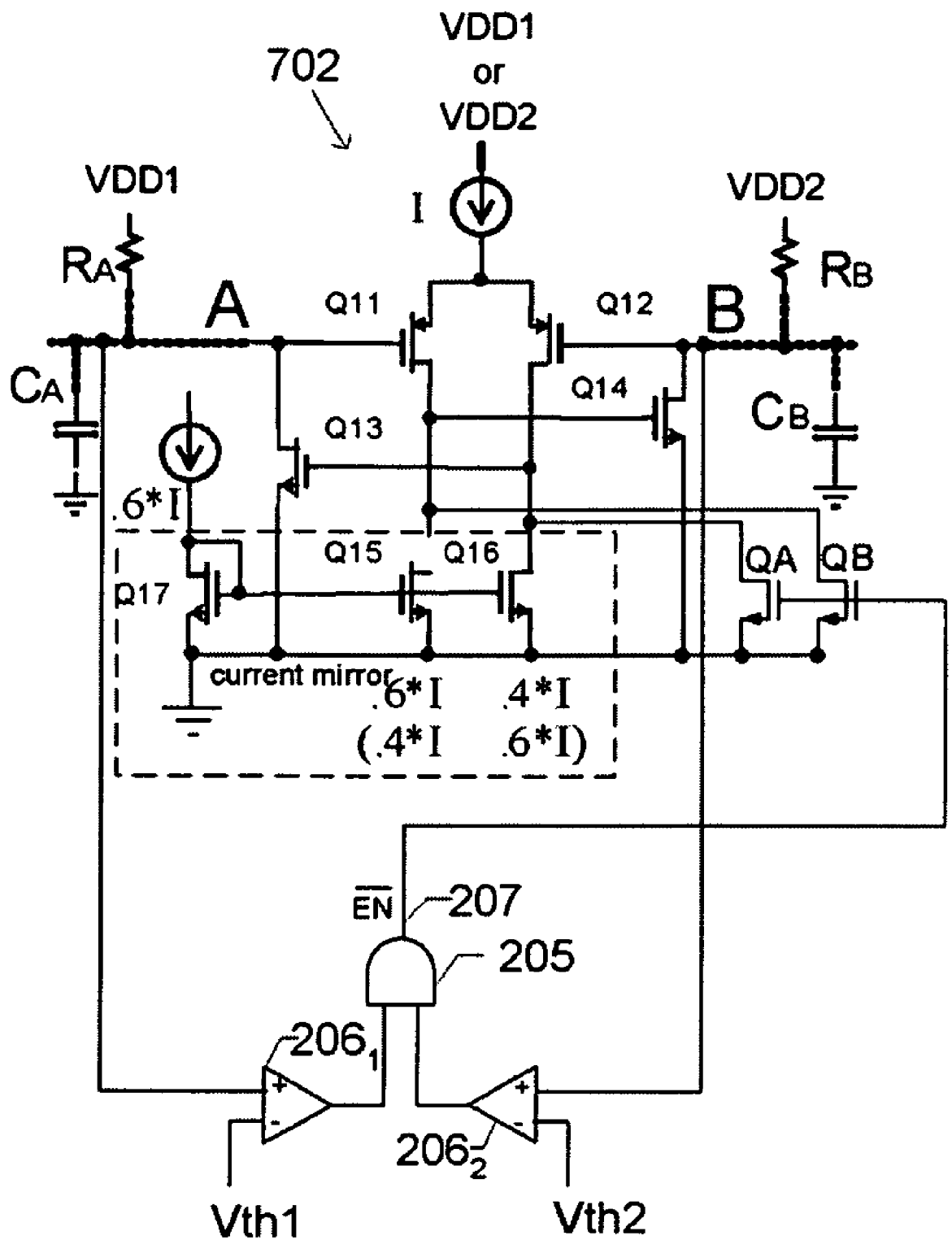
FIG. 7a illustrates how level shifting can be provided for a specific bi-directional buffer, in accordance with an embodiment of the present invention.

Embodiments of the present invention can be used with most any bi-directional buffer. In other words, embodiments of the present invention need not be limited to use with any specific circuitry from implementing a bi-directional buffer (e.g., for implementing $203_1$ and $203_2$, or more generally, for implementing 102). Nevertheless, FIG. 7a is used to provide an example of how the above described embodiments of the present invention can be used to add level shifting to a specific bi-directional buffer disclosed in U.S. patent application Ser. No. 12/060,829, entitled "Bi-Directional Buffer for Open-Drain or Open-Collector Bus", which was filed Apr. 1, 2008, and which has been incorporated herein by reference.

FIG. 7a shows details of a bi-directional buffer 702 that includes a pair of PMOS transistors Q11 and Q12 connected as a differential input pair, a tail current source I (which generates a current I), output stage NMOS transistors Q13 and Q14, and active load NMOS transistors Q15 and Q16 that form a current mirror along with NMOS transistor Q17. Transistors Q15 and Q16 may also be referred herein to as current sink transistors. The sources of transistors Q15, Q16 and Q17 are shown as being connected to ground. The gate of transistor Q11 provides the first input/output node of the differential input/differential output op-amp, and the gate of transistor Q12 provides the second input/output node of the differential input/differential output op-amp.

Transistors Q15, Q16 and Q17 form a current mirror having one input and two outputs. The common input of the current mirror is provided at the drain of transistor Q17, and the two outputs of the current mirror are provided at the drains of the active load transistors Q15 and Q16. In the FIG. 7a, each active load transistor Q15 and Q16 is shown as being set to sink current equal to 60% of the tail current I. Since the sum of the sink currents exceeds the available tail current I, only one load (transistor Q15 or Q16) will be active at a time. The other load (transistor Q15 or Q16) will collapse (since only 40% of tail current is available) and short the gate of one of the output devices (transistor Q13 or Q14). More generally, each active load transistor Q15 and Q16 is set to sink a current equal to P*I, where the coefficient P represents a portion or fraction of the tail current, and P>0.5. This will result in only one of the loads Q15 and Q16 being active at one time, while the other load collapses because it does not receive enough current. In the example discussed herein, P=0.6, but other values can be used. For another example, P=0.7. There are many different types of current mirrors that can be used, other than the simple type illustrated. Such current mirrors will have one input and two outputs, where only one output is active at a time, while the other collapses.

Assuming the comparators $206_1$ and $206_2$, the AND logic gate 205 the transistors QA and QB were not present, the bi-directional buffer 702 operates as follows. Suppose initially both nodes A and B are high, i.e., have a HIGH voltage level, corresponding to a logic level 1. Exemplary HIGH voltage levels are +5V or +3.3V, but are not limited thereto. When nodes A and B are both high, both transistors Q11 and Q12 are turned off, as are transistors Q13 and Q14. Thus, nodes A and B are disconnected when nodes A and B are both high.

Now, suppose node A is brought down to a LOW voltage level, corresponding to a logic level 0, e.g., by an external interface device connected to node A. An exemplary LOW voltage level is ground (GND), but other levels, such as −3.3V or −5V are possible. When the voltage at the gate of transistor Q11 is low enough, the tail current source I becomes active and provides current to the differential pair of transistors Q11 and Q12. Since the voltage at the gate of transistor Q11 is lower than the voltage at the gate of transistor Q12, the drain current of transistor Q11 sets at a 60%*I level. This leaves only 40% of the current I available to transistors Q12 and Q16 (i.e., the drain current of transistor Q12 sets at a 40%*I level). As a result, transistor Q16 will be in triode mode (where its drain voltage is close to its source voltage), which will result in the shorting of the gate of transistor Q13 to ground (thus turning off transistor Q13), causing the bi-directional buffer 702 to attain the configuration shown in FIG. 7b. Referring to FIG. 7b, in this configuration the bi-directional buffer 702 will serve as a follower and will make node B follow node A.

Similarly, if node B is brought down (e.g., by an external interface device B), the bi-directional buffer 702 will re-configure itself to attain the configuration depicted in FIG. 7c. This configuration results from transistor Q15 being put into triode mode, which results in the shorting of the gate of transistor Q14 to ground (thus turning off transistor Q14). Referring to FIG. 7c, in this configuration the bi-directional buffer 702 will act as a follower and will make node A follow node B.

In the above described manner, the bi-directional buffer 702 facilitates bi-directional data transfer by re-configuring itself according to the direction of data flow. A benefit of the bi-directional buffer 702 is that it not susceptible to latch-up, since there is only one amplifier and only one feedback loop (of two possible feedback loops) active at a time.

In summary, the bi-directional buffer 702 has two configuration states, which depend on the data transfer direction, and may also depend on time constants. When node A is pulled down externally, the first configuration state (FIG. 7b) is attained, and the buffer pulls down node B. When node B is pulled down externally, the second configuration state (FIG. 7c) is attained, and buffer pulls node A down. Thus, bi-directional transfer of high-to-low transition occurs.

Bi-directional transfer of low-to-high transition occurs as follows. Suppose initially node A is pulled down by external interface device A so that the first configuration state (FIG. 7b) results. When node A is released, two scenarios are possible. In the first scenario, where τA>τB, node B will tend to rise faster than node A, the voltage potential at the gate of transistor Q12 will be higher than at the gate of transistor Q11, the circuit will remain in the same configuration state, and the faster node B will follow the slower node A. The circuit will stay in the same configuration state (FIG. 7b) until transistors Q11 and Q12 are conducting. When nodes A and B are high enough to turn off transistors Q11 and Q12, the nodes will continue to rise independently, each with its own time constant. In the second scenario, where τA<τB, node A will tend to rise faster than node B, causing the voltage potential at the gate of transistor Q11 to be higher than at the gate of transistor Q12, at which point the circuit will switch from the first configuration (FIG. 7b) into the second configuration (FIG. 7c). Now faster node A will follow slower node B. And again, when transistors Q11 and Q12 are turned off, the nodes will raise independently—each with its own time constant. Similar action takes place, when node B is pulled down and then released, thus achieving bi-directional transfer of low-to-high transition.

Referring back to FIG. 7a, the operation of the comparators $206_1$ and $206_2$, the logic circuitry 205, and the transistors QA and QB, will now be explained. When the voltages at nodes A and B are below their corresponding thresholds (which may, or may not be the same threshold), the output 207 of the AND gate will be low, which will cause NMOS transistors QA and QB to be turned off, and the bi-directional buffer circuitry 702 connected between nodes A and B will function in the manner just described above with reference to FIGS. 7a-7c. When the voltages at nodes A and B are above their corresponding thresholds, the output 207 of the AND gate 205 will be high, which will turn on NMOS transistors QA and QB. When transistors QA and QB are on, the gates of output transistors Q13 and Q14 will be shorted to ground, which will turn off the transistors Q13 and Q14, thereby disabling the bi-directional buffer circuitry 702 connected between nodes A and B. Stated another way, when transistors QA and QB are on (which causes the gates of output transistors Q13 and Q14 to be shorted to ground), the transistors Q13 and Q14 are turned off, thereby disconnected node A from node B. This allows node A to be pulled up to VDD1, and node B to be pulled up to VDD2. When the voltage at node A falls below its corresponding threshold (Vth1), or the voltage at node B falls below its corresponding threshold (Vth2), the output of the AND gate will be will be low, which will cause NMOS transistors QA and QB to be turned off again, and the bi-directional buffer circuitry 702 connected between nodes A and B will function in its normal manner.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A method for use with a bi-directional buffer that includes first voltage buffer circuitry that causes a first node to follow a second node, and second voltage buffer circuitry that causes the second node to follow the first node, the method comprising:
   simultaneously providing a same disable signal to the first voltage buffer circuitry and the second voltage buffer circuitry when
      the voltage of the first node exceeds a first threshold voltage, and
      the voltage of the second node exceeds a second threshold voltage.

2. The method of claim 1, wherein the first and second threshold voltages are the same.

3. The method of claim 1, wherein the first and second threshold voltages are different.

4. The method of claim 1, wherein the first node is connected by a first pull-up resistor to a first voltage supply rail, and the second node is connected by a second pull-up resistor to a second voltage supply rail that is different than the first voltage supply rail, and wherein:
   GND<first threshold voltage<the first voltage supply rail; and
   GND<second threshold voltage<the second voltage supply rail.

5. The method of claim 1, further comprising:
   simultaneously providing a same enable signal to the first voltage buffer circuitry and the second voltage buffer circuitry when
   a voltage of the first node does not exceed a first threshold voltage, and/or
   a voltage of the second node does not exceed a second threshold voltage.

6. The method of claim 1, wherein the first and second threshold voltages can be the same, or different.

7. A bi-directional buffer, comprising:
   first voltage buffer circuitry that causes a first node to follow a second node;
   second voltage buffer circuitry that causes the second node to follow the first node; and
   further circuitry to selectively provide an enable signal or a disable signal to the first voltage buffer circuitry and the second voltage buffer circuitry;
   wherein the further circuitry simultaneously provides the same disable signal to both the first voltage buffer circuitry and the second voltage buffer circuitry when the voltage of the first node exceeds the first threshold voltage, and the voltage of the second node exceeds the second threshold voltage.

8. The bi-directional buffer of claim 7, wherein the first and second threshold voltages are the same.

9. The bi-directional buffer of claim 7, wherein the first and second threshold voltages are different.

10. The bi-directional buffer of claim 7, wherein the first node is connected by a first pull-up resistor to a first voltage supply rail, and the second node is connected by a second pull-up resistor to a second voltage supply rail, and wherein:
    GND<first threshold voltage<the first voltage supply rail; and
    GND<second threshold voltage<the second voltage supply rail.

11. The bi-directional buffer of claim 7, wherein at least some of the same circuitry is included in both the first voltage buffer circuitry and the second voltage buffer circuitry.

12. The bi-directional buffer of claim 7, wherein:
    the further circuitry simultaneously provides the same enable signal to the first voltage buffer circuitry and the second voltage buffer circuitry when a voltage of the first node does not exceed a first threshold voltage, and/or a voltage of the second node does not exceed a second threshold voltage.

13. A bi-directional buffer, comprising:
    first voltage buffer circuitry that causes a first node to follow a second node;
    second voltage buffer circuitry that causes the second node to follow the first node; and
    further circuitry to selectively provide an enable signal or a disable signal to the first voltage buffer circuitry and the second voltage buffer circuitry;
    wherein the further circuitry includes
       logic circuitry including first and second inputs and an output that produces an enable signal or a disable signal that is provided to the first and second voltage buffer circuitry;
       a first comparator including a non-inverting (+) input connected to the first node, an inverting (−) input that receives the first threshold voltage, and an output that is connected to the first input of the logic circuitry; and
       a second comparator including a non-inverting (+) input connected to the second node, an inverting (−) input that receives the second threshold voltage, and an output that is connected to the second input of the logic circuitry;
    wherein the further circuitry simultaneously provides the same disable signal to the first voltage buffer circuitry and the second voltage buffer circuitry when the voltage of the first node exceeds the first threshold voltage, and the voltage of the second node exceeds the second threshold voltage.

14. The bi-directional buffer of claim 13, wherein the first and second threshold voltages can be the same or different.

15. The bi-directional buffer of claim 13, wherein the logic circuitry comprises an AND gate.

16. The bi-directional buffer of claim 13, wherein the further circuitry simultaneously provides the same enable signal to the first voltage buffer circuitry and the second voltage buffer circuitry when a voltage of the first node does not exceed a first threshold voltage, and/or a voltage of the second node does not exceed a second threshold voltage.

17. A system comprising:
a first bus line segment;
a second bus line segment;
a first pull-up resistor connected between the first bus line segment and a first high voltage supply rail; and
a second pull-up resistor connected between the second bus line segment and a second high voltage supply rail;
a bi-directional buffer, connected between the first and second bus line segments, wherein the bi-direction buffer includes
  first voltage buffer circuitry that causes the first bus line segment to follow the second bus line segment;
  second voltage buffer circuitry that causes the second bus line segment to follow the first bus line segment; and
circuitry to selectively provide an enable signal or a disable signal to the first buffer circuitry and the second buffer circuitry of the bi-directional buffer;
wherein the circuitry simultaneously provides the same disable signal to the first buffer circuitry and the second buffer circuitry, to thereby disable the bi-directional buffer, when the voltage of the first bus line segment exceeds the first threshold voltage, and the voltage of the second bus line segment exceeds the second threshold voltage; and
wherein when the bi-directional buffer is disabled, the first bus line segment can be pulled up to the first voltage supply rail, and the second bus line segment can be pulled up to the second voltage supply rail.

18. The system of claim 17, wherein the first and second threshold voltages can be the same or different.

19. The system of claim 17, further comprising:
a first capacitance between the first bus line segment and a low voltage rail; and
a second capacitance between the second bus line segment and the low voltage rail.

20. The system of claim 17, wherein the circuitry simultaneously provides the same enable signal to the first voltage buffer circuitry and the second voltage buffer circuitry when a voltage of the first bus line segment does not exceed a first threshold voltage, and/or a voltage of the second bus line segment does not exceed a second threshold voltage.

21. The system of claim 17, wherein the circuitry to selectively provide the enable signal or the disable to the first buffer circuitry and the second buffer circuitry, includes:
logic circuitry including first and second inputs and an output that produces the enable signal or the disable signal;
a first comparator including a non-inverting (+) input connected to the first node, an inverting (−) input that receives the first threshold voltage, and an output that is connected to the first input of the logic circuitry; and
a second comparator including a non-inverting (+) input connected to the second node, an inverting (−) input that receives the second threshold voltage, and an output that is connected to the second input of the logic circuitry.

22. The system of claim 21, wherein the logic circuitry comprises an AND gate.

23. A printed circuit board (PCB) card, comprising:
a terminal that connects the PCB card to a system backplane;
a bi-directional buffer, connected between the terminal and an internal node of the PCB card, wherein the bi-direction buffer includes
  first voltage buffer circuitry that causes the terminal to follow the internal node of the PCB card, and
  second voltage buffer circuitry that causes the internal node of the PCB card to follow the terminal; and
circuitry to selectively provide an enable signal or a disable signal to the first buffer circuitry and the second buffer circuitry of the bi-directional buffer;
wherein the circuitry simultaneously provides the same disable signal to the first buffer circuitry and the second buffer circuitry of the bi-directional buffer when the voltage of the terminal exceeds the first threshold voltage, and the voltage of the internal node exceeds the second threshold voltage.

24. The PCB card of claim 23, wherein the first and second threshold voltages can be the same or different.

25. The PCB card of claim 23, wherein the circuitry simultaneously provides the same enable signal to the first buffer circuitry and the second buffer circuitry of the bi-directional buffer when a voltage of the terminal does not exceed a first threshold voltage, and/or a voltage of the internal node does not exceed a second threshold voltage.

26. The PCB card of claim 23, wherein the circuitry, to selectively provide the enable signal or the disable signal to the first buffer circuitry and the second buffer circuitry of the bi-directional buffer, includes:
logic circuitry including first and second inputs and an output that produces the enable signal or the disable signal;
a first comparator including a non-inverting (+) input connected to the first node, an inverting (−) input that receives the first threshold voltage, and an output that is connected to the first input of the logic circuitry; and
a second comparator including a non-inverting (+) input connected to the second node, an inverting (−) input that receives the second threshold voltage, and an output that is connected to the second input of the logic circuitry.

27. The PCB card of claim 26, wherein the logic circuitry comprises an AND gate.

* * * * *